United States Patent
Meister et al.

(10) Patent No.: US 7,618,183 B2
(45) Date of Patent: Nov. 17, 2009

(54) ANALOGUE DISPLAY MEMBER MADE OF CRYSTALLINE MATERIAL, TIMEPIECE FITTED THEREWITH AND METHOD FOR FABRICATING THE SAME

(75) Inventors: Pierre-André Meister, Bienne (CH); André Zanetta, Neuchâtel (CH); Emmanuel Fleury, Moutier (CH); Fabien Blondeau, Chézard St-Martin (CH)

(73) Assignee: ETA SA Manufacture Horlogère Suisse, Grenchen (CH)

( * ) Notice: Subject to any disclaimer, the term of this patent is extended or adjusted under 35 U.S.C. 154(b) by 0 days.

(21) Appl. No.: 11/913,984

(22) PCT Filed: May 1, 2006

(86) PCT No.: PCT/EP2006/061949

§ 371 (c)(1),
(2), (4) Date: Nov. 9, 2007

(87) PCT Pub. No.: WO2006/122873

PCT Pub. Date: Nov. 23, 2006

(65) Prior Publication Data
US 2008/0198702 A1    Aug. 21, 2008

(30) Foreign Application Priority Data
May 12, 2005    (EP) ................. 05103979

(51) Int. Cl.
*G04B 31/00*    (2006.01)
*G04B 29/00*    (2006.01)
(52) U.S. Cl. ............... 368/324; 74/162; 368/322
(58) Field of Classification Search ........... 368/238, 368/324, 322; 384/37; 74/162
See application file for complete search history.

(56) References Cited

U.S. PATENT DOCUMENTS

| 5,623,456 A | 4/1997 | Miyamoto et al. |
| 6,871,643 B2 * | 3/2005 | Cooper et al. ............... 124/25.6 |
| 2003/0112713 A1 * | 6/2003 | Kaelin ........................ 368/281 |

FOREIGN PATENT DOCUMENTS

| EP | 0 555 753 A1 | 8/1993 |
| EP | 0 732 635 A1 | 9/1996 |
| EP | 1 513 029 A1 | 3/2005 |
| JP | 61-245078 | 10/1986 |

OTHER PUBLICATIONS

Tjerkstra, R.W., et al., "Electrochemical Fabrication of Multi Walled Micro Channels," Proceedings of Micro Total Analysis Systems 98 Workshop, pp. 133-136, 1998.
Madou, Marc, "Fundamentals of Microfabrication," Chapter 2—Pattern Transfer with Dry Etching Techniques, pp. 53-88. 1997.
International Search Report issued in corresponding application No. PCT/EP2006/061949, completed Aug. 10, 2006 and mailed Aug. 21, 2006.

\* cited by examiner

*Primary Examiner*—Renee S Luebke
*Assistant Examiner*—Sean Kayes
(74) *Attorney, Agent, or Firm*—Griffin & Szipl, P.C.

(57) ABSTRACT

The invention proposes an analogue display member (10) fitted to a timepiece, of the type including a main body in which an arbor hole is arranged, characterized in that the main body is made of silicon based crystalline material. The invention also proposes a timepiece provided with such a display member (10). The invention also proposes a method of fabricating analogue display members (10) to be fitted to timepieces, each analogue display member (10) including a main body, characterized in that it includes at least one step of micro-machining a wafer of silicon based crystalline material to form at least one main body in said material.

19 Claims, 3 Drawing Sheets

ANALOGUE DISPLAY MEMBER MADE OF CRYSTALLINE MATERIAL, TIMEPIECE FITTED THEREWITH AND METHOD FOR FABRICATING THE SAME

This is a National Phase Application in the United States of International Patent Application No. PCT/EP2006/061949 filed May 1, 2006, which claims priority on European Patent Application No. 05103979.0, filed May 12, 2005. The entire disclosures of the above patent applications are hereby incorporated by reference.

FIELD OF THE INVENTION

The invention concerns an analogue display member such as a timepiece hand.

The invention also concerns a timepiece and a method of fabricating a display member.

BACKGROUND OF THE INVENTION

The fabrication of a hand for use as a display member in a timepiece is particularly complex, in particular when the hand is to be fitted to a top of the range timepiece, for which the hand has to have a particularly polished surface appearance, possibly with facets.

Currently, hands are fabricated in brass, steel, gold, aluminium, or in a special alloy. They can be galvanically treated, covered with paint, oxidized or untreated if the material used is gold. They are generally made by machining or die stamping.

However, satisfactory dimensional precision can still not be obtained with the machining and die stamping techniques for these materials, and additional operations of deburring, polishing, etc are required to obtain the final shape of the hand.

Moreover, it is generally necessary to apply multiple treatments to the hands to guarantee high quality surface finish.

Further, current hand fabricating techniques do not allow all desired forms to be achieved, thereby curbing the creativity of timepiece designers.

It is an object of the present invention to propose a hand that is easier to fabricate while offering great design freedom as to its form, and that can be fabricated in series so as to minimize production costs.

SUMMARY OF THE INVENTION

The invention thus proposes an analogue display member fitted to a timepiece, of the type comprising a main body in which an arbor hole is arranged, the arbor hole being fitted to a drive arbor, characterized in that the main body is made of silicon based crystalline material. Preferably, the main body of the analogue display member has the shape of a timepiece hand.

The display member according to the invention has the advantage of being able to be easily fabricated using technology proven in microelectronics for fabricating integrated circuits and in micromechanics for fabricating microstructures.

Silicon has the advantage of being very light, since its density is approximately 2.49 kg/dm3, which minimizes the mass of the display member, and thus problems of inertia and unbalance, in particular when it takes the form of a hand. Moreover, the reduction in unbalance and inertia of the display member has a positive influence on the sizing of the display member drive means and on the energy consumption of said drive means.

According to other features of the invention:
the main body comprises a proximal portion, in which the arbor hole is arranged, and a distal portion which forms the indicator section of the hand, and the distal portion is linked to the proximal portion by at least one beam whose width, in a transverse plane to the arbor, is less than or equal to a hundred microns;
the main body includes, in the thickness thereof, a multitude of bores which are parallel to the drive arbor and which have a diameter smaller than fifty microns.
the top surface of the main body includes embossed patterns;
the top surface of the main body includes facets;
at least one face of the main body is provided with a coating made of a different material from the main body;
the coating is made of metal;
the display member includes at least one integrated circuit element that is arranged in the thickness of the main body;
the crystalline material is monocrystalline silicon.

The invention also proposes a timepiece characterized in that it includes at least one analogue display member in accordance with one of the preceding features.

The invention further proposes a method of fabricating analogue display members to be fitted to timepieces, each analogue display member comprising a main body in which an arbor hole is arranged, the arbor hole being fitted to a drive arbor, characterized in that it includes at least one step of micro-machining a plate of silicon based crystalline material so as to make at least one main body in said crystalline material with its arbor hole.

This method is easy to implement to mass-produce precise, light pieces.

According to other features of the method according to the invention:
during the plate micro-machining step, flexible elements are formed on the main body to allow the analogue display member to be mounted on the drive arbor by resilient deformation of the flexible elements;
the micro-machining step is implemented so as to make several analogue display members simultaneously in the same plate;
the micro-machining step includes at least one lithographic step for reproducing the contours of at least one portion of the main body of one analogue display member on the plate;
the method includes at least one step of depositing a coating on at least one face of the main body of each analogue display member;
the method includes at least one step of micro-machining the top face of the main body in order to form embossed patterns thereon;
the method includes at least one step of micro-machining the top face of the main body in order to make facets thereon;
the crystalline material is monocrystalline silicon.

BRIEF DESCRIPTION OF THE DRAWINGS

Other features and advantages of the present invention will appear more clearly upon reading the following detailed description, made with reference to the annexed drawings, given by way of non-limiting example and in which.

DETAILED DESCRIPTION OF THE ILLUSTRATIVE EMBODIMENTS

FIGS. 1 to 7 show several steps of a method for fabricating analogue display members 10 in accordance with the teaching of the invention.

Figure 9:
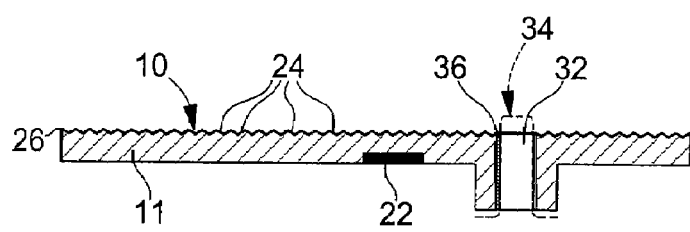
FIG. 9 is a vertical cross-section that shows schematically a hand obtained by the method according to the invention.

Analogue display members 10 are here hands 10, one example of which is shown schematically in FIG. 9.

In accordance with the teaching of the invention, each hand 10 includes a main body 11 which is made of silicon based crystalline material.

"Silicon based crystalline material" here means a crystalline material containing silicon such as monocrystalline silicon, polycrystalline silicon and quartz.

Preferably, hand 10 according to the invention is micro-machined in a monocrystalline silicon plate 12 like those that are used to make integrated electronic circuits, such plates being generally called "wafers".

Advantageously, a series of several hands 10 is made in the same silicon wafer 12, in accordance with a method called "batch processing", using techniques derived from microelectronics which enable mechanical micro-structures to be fabricated in a silicon wafer 12.

These techniques are already implemented for fabricating pressure sensors, accelerometers, micro-actuators, and micro-pumps. They mainly comprise two types of fabricating methods which are dry etching and wet etching.

These methods generally use masking techniques which locally remove a layer of material of a determined thickness.

Dry etching methods use, for example, a laser beam or a high density plasma source.

According to a preferred embodiment of the invention, technologies for micro-machining silicon wafer 12 are used so as to make hands 10 directly in the thickness of the silicon wafer.

Electro-polishing is an example of a technique used for silicon etching. This technique uses the property of monocrystalline silicon of being porosified by anodic electrochemical etching in a hydrofluoric acid using a low current density, this technique being able to remove the silicon completely with high current densities.

An example implementation of the silicon electropolishing technique is described in the publication entitled "Electrochemical Fabrication of Multiwalled Micro Channels" by R. W. Tjerkstra et al, pages 133-136 of "Proceedings of Micro Total Analysis Systems 98 Workshop" Banff, Canada, within the scope of the fabrication of coaxial micro channels whose separating walls are made of porous silicon. Reference can be made to this publication, incorporated herein by reference, for more detail on this method.

Other examples of silicon micro-machining methods are described in the work entitled "Fundamentals of microfabrication" by Marc Madou, edited by CRC Press, and bearing the reference ISBN 0-8493-9451-1, incorporated herein by reference, to which reference can be made for further details.

The main steps of the method according to the invention will now be described in a simplified manner.

Figure 1:
FIGS. 1 to 6 are vertical cross-sections which illustrate schematically several steps of a method of fabricating timepiece hands from a silicon plate in accordance with the teaching of the invention.

FIG. 1 shows a silicon wafer 12 prior to implementation of the method according to the invention.

Figure 2:
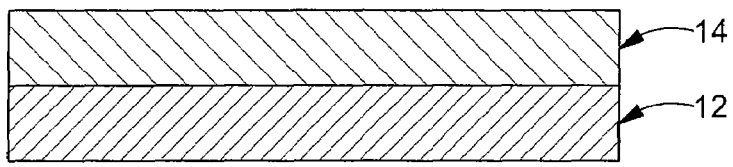

FIG. 2 illustrates a step of depositing a sacrificial layer 14 on the top face of silicon wafer 12.

Figure 3:
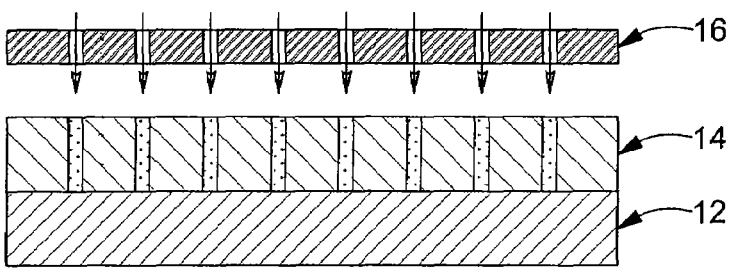
Figure 4:
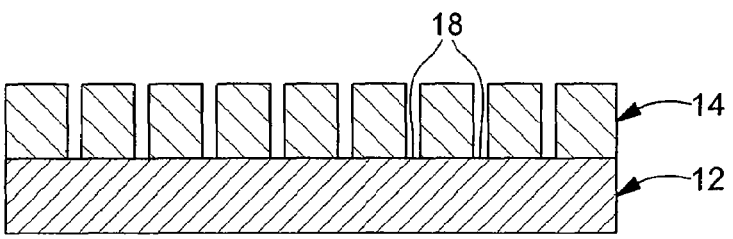

FIG. 3 illustrates the treatment of sacrificial layer 14, through a mask 16, for locally altering the structure of sacrificial layer 14 so as to draw a pattern representing a series of hands 10 on silicon wafer 12.

Figure 5:
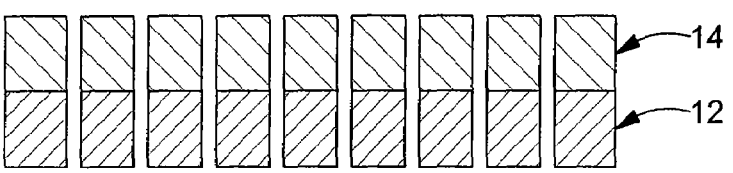

In FIG. 5, silicon wafer 12 has been etched through the sacrificial layer, preferably in accordance with an anisotropic etching technique, such that the pattern representing hands 10 is now drawn in the thickness of silicon wafer 12.

Figure 6:
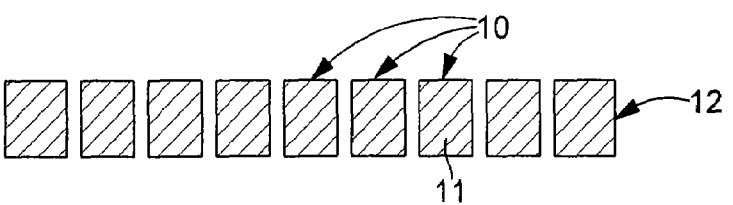
Figure 7:
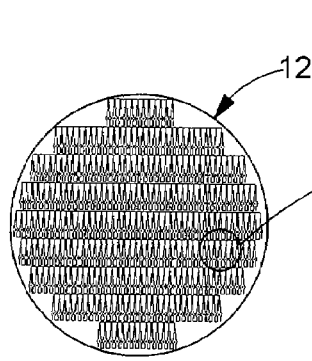
FIGS. 7a and 7b are top views that show schematically the silicon plate at the step illustrated in FIG. 6.
Figure 7:
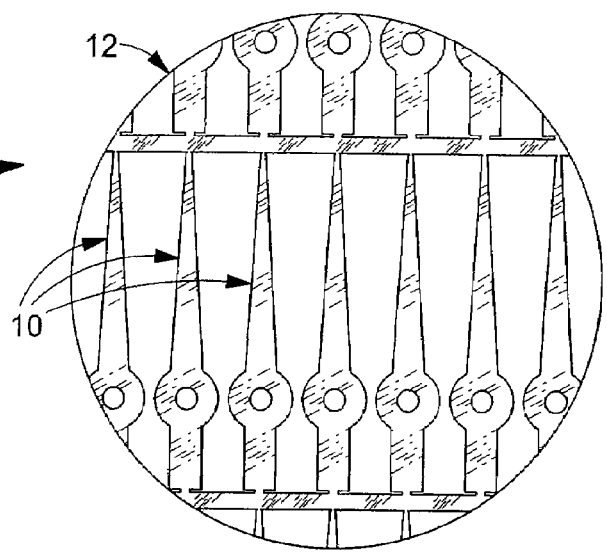

The remaining sacrificial layer 14 is then removed, as shown in FIG. 6.

A silicon wafer 12, in which hands 10 are pre-cut and remain attached to the body of wafer 12 via bridges of material, is thus obtained, as shown in FIGS. 7a and 7b.

The final fabrication step of hands 10 consists in detaching the hands from silicon wafer 12.

Advantageously, the method according to the invention can comprise at least one step during which a coating, for example of metal, is deposited on the silicon forming hands 10. This coating can be deposited in accordance with chemical vapour deposition or physical vapour deposition techniques.

The method according to the invention can also comprise a chemical and/or thermal treatment step applied to the surface of the silicon forming hands 10, for example in order to alter the aspect of the silicon surface.

It should be noted that the etching steps can also be implemented so as to alter the appearance of the silicon surface, or so as to alter the surface appearance of a coating deposited on the silicon, by making geometrical or other patterns, which provides interesting optical effects. Such geometrical patterns may, for example, give a needle etching type appearance to the surface of hands 10 made in the silicon. Such etching steps can be implemented when hands 10 are still carried by silicon wafer 12.

According to the embodiment shown in FIG. 9, the top face of hand 10 is provided with embossed geometric patterns 24 which were made by silicon etching. A metal deposition 26 was made on these geometric patterns 24 which gives hand 10 an needle etched metallic external appearance. It should be noted that this result would be very difficult to obtain with a hand 10 whose main body 11 is made of metal.

Figure 10:
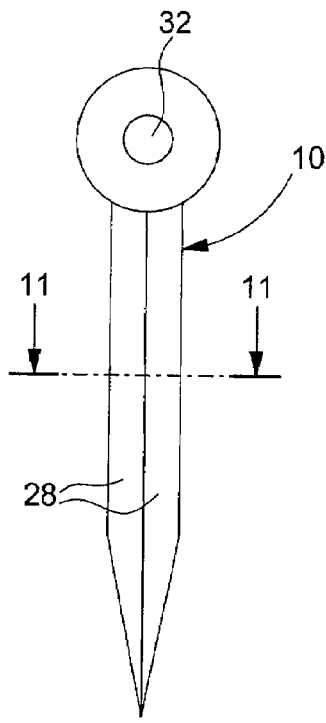
FIG. 10 is a top view that shows schematically a hand obtained by the method according to the invention provided with two longitudinal facets.
Figure 11:
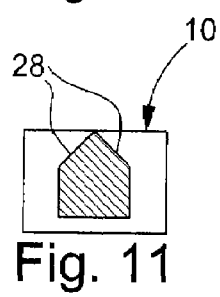
FIG. 11 is a vertical cross-section along the cross-sectional plane 11-11 of the hand of FIG. 10.

According to the embodiment shown in FIGS. 10 and 11, two longitudinal facets 28 have been etched in the top face of hand 10.

Depending upon the embodiments, patterns 24 and facets 28 can have curved profiles so as to form waves in the surface of hand 10.

It should be noted that the method of fabricating hands 10 according to the invention easily allows hands 10 to be made with very varied external appearances.

Advantageously, the method according to the invention can be implemented in parallel on several silicon wafers 12, so as to make hands 10 with similar features simultaneously in several silicon wafers 12.

Figure 8:
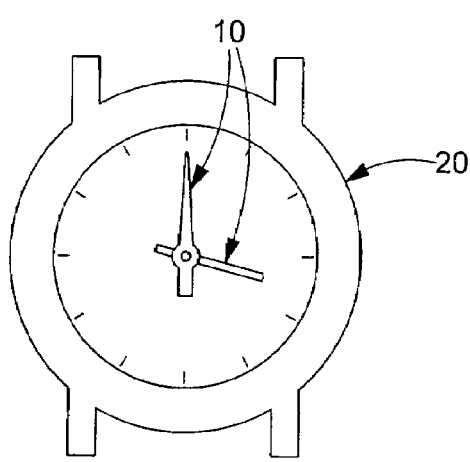
FIG. 8 is a top view that shows schematically a watch fitted with at least one hand obtained by the method according to the invention.

FIG. 8 shows a watch 20 which his provided with at least one silicon hand 10 made in accordance with the method according to the invention.

Each hand 10 is to be connected in rotation to an arbor or a wheel of the watch movement (not shown) of watch 20. Hand 10 is thus provided here with an arbor hole 32 to be driven onto a drive arbor 34.

Advantageously, the inner axial surface of arbor hole 32 is provided with a layer 36 of material enabling hand 10 to be driven in by deforming layer 36 or by sliding against layer 36 limiting the risk of breaking main body 11.

According to an alternative embodiment, hand 10 according to the invention can be bonded or welded onto drive arbor 34.

According to an advantageous embodiment of the invention, which is shown in FIG. 9, an integrated circuit element 22 is made in the thickness of silicon wafer 12, in the body 11 of hand 10.

Integrated circuit element 22 can be made, in accordance with conventional microelectronic fabrication techniques, before, during or after implementation of the fabrication method according to the invention. Thus, integrated circuit elements 22 can be made beforehand in silicon wafer 12 as shown in FIG. 1, from which hands 10 are fabricated.

Integrated circuit element 22 can be electrically connected to the control circuit of watch 20, through the rotational arbor of hand 10.

Integrated circuit element 22 includes, for example, an integrated light emitting diode in the thickness of hand 10. Hand 10 can thus be lit from the inside, by exploiting the transparent properties of silicon.

Integrated circuit element 22 can include a sensor provided for supplying the control circuit of watch 20 with indications as to the angular position of hand 10 in relation to the dial.

Figure 12:
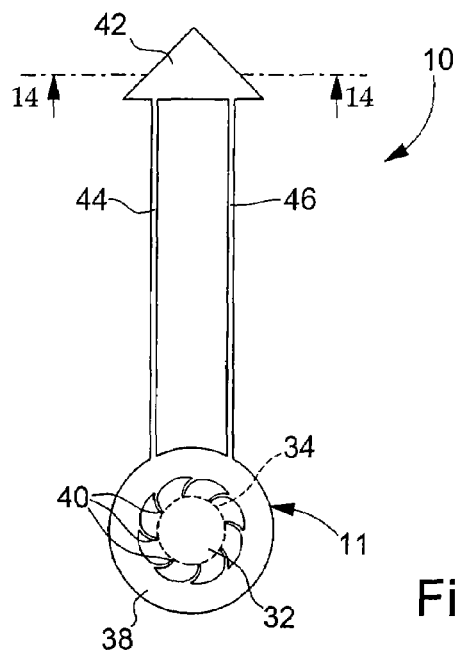
FIG. 12 is a top view that shows schematically a hand obtained by the method according to the invention provided with two connecting beams.
Figure 13:
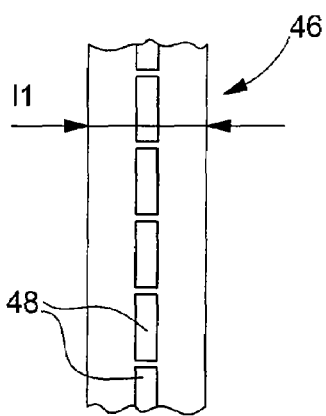
FIG. 13 is an enlarged view of a section of beam of FIG. 12.
Figure 14:
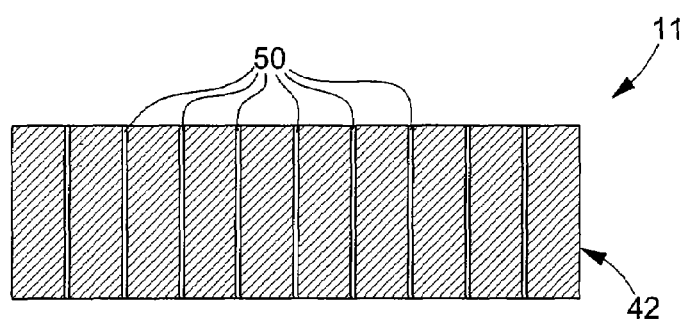
FIG. 14 is an axial cross-section along the plane 14-14 that shows, in an enlarged manner, the distal end portion of the hand of FIG. 12.

FIGS. 12 to 14 show an improved embodiment in which hand 10 is made entirely of silicon, i.e. its main body 11, which forms the mechanical structure of hand 10, is made of silicon and defines the external shape of hand 10. of course, main body 11 can be coated with one or several layers of coatings, such as metallic coatings.

According to the embodiment shown, main body 11 includes an annular proximal portion 38 in which arbor hole 32 is arranged for mounting hand 10 on drive arbor 34 of watch 20. Arbor hole 32 is provided to be fitted onto drive arbor 34, such that hand 10 is fixed onto drive arbor 34 in a manner similar to driving in.

Arbor hole 32 is provided here with flexible elements 40 in the form of tongues that are made in a single piece with the proximal portion 38 of main body 11 and which project onto the inner surface of arbor hole 32. Flexible elements 40 are provided to deform resiliently when hand 10 is mounted on drive arbor 34. Thus, after assembly, flexible elements 40 exert a gripping force on drive arbor 34 which holds hand 10 axially on drive arbor 34 and connects the two elements in rotation.

Flexible elements 40 are preferably formed during the step of micro-machining silicon wafer 12.

Main body 11 also includes a distal portion 42 which forms the indicator section of hand 10. The distal portion 42 has the form here of a triangle but it could take any other suitable form for indicating a determined angular position on the dial of timepiece 20.

Distal portion 42 is connected to proximal portion 38 by two beams 44, 46 whose width 11, in a transverse plane to drive arbor 34, is comprised between thirty and two hundred microns, and is preferably equal to fifty microns. The width 11 of fifty microns offers a good compromise between rigidity and fineness for beam 44, 46.

One thus obtains a hand 10 of which practically only the proximal portion 38 and the distal portion 42 are visible, when the user of watch 20 consults the indications given by hand 10, in particular in a top view. Indeed, combined with the very small thickness, comprised for example between thirty and a hundred microns, preferably equal to fifty microns, the small width 11 makes beams 44, 46 almost invisible to the naked eye and thus to make the elements underneath hand 10 more visible, between proximal portion 38 and distal portion 42, particularly elements displayed on the dial of watch 20. Moreover, the use of these almost invisible beams 44, 46 offers more freedom in the design of hand 10, by concealing part of the structure of hand 10.

Of course, hand 10 according to the invention can include more than two beams 44, 46. The number of beams 44, 46 could be chosen as a function of the shape of hand 10, particularly as a function of the shape of distal portion 42, in order to ensure sufficient rigidity and shock resistance for hand 10.

FIG. 13, which is an enlarged view of a beam 46 of FIG. 12, it can be seen that beams 46 can be provided with recesses 48 which are arranged in a suitable manner to lighten the structure of hand 10 without significantly penalizing its rigidity and shock resistance. Recesses 48 are formed here of apertures or windows which are aligned and distributed over the length of beam 46 defining bridges of material between the two parallel parts forming beam 46.

Advantageously, as can be seen in FIG. 14, main body 11 of hand 10 includes, in its axial thickness, a multitude of generally cylindrical bores 50 which are substantially parallel to drive arbor 34 and which have a diameter smaller than fifty microns, preferably a diameter comprised between three and ten microns. The object of these bores 50 is to reduce the unbalance and inertia of hand 10. Since the mass of the beams has very little influence on the unbalance and inertia of hand 10, bores 50 are preferably arranged only in distal portion 42, but they could also be arranged in the other parts of main body 11.

Bores 50 here pass through the entire thickness of main body 11. they have sufficiently small dimensions to be invisible to the naked eye for the user of watch 20, such that they do not adversely affect the aesthetic appearance of hand 10.

What is claimed is:

1. A method of fabricating analogue display members to be fitted to timepieces, each analogue display member including a main body in which an arbor hole is arranged, the arbor hole being fitted to a drive arbor, wherein said method includes at least one step of micro-machining a wafer of silicon based crystalline material to make at least one main body in said crystalline material with said arbor hole and wherein, during the wafer micro-machining step, flexible elements are formed on the main body to allow assembly of the analogue display member on the drive arbor via the resilient deformation of the flexible elements.

2. The fabrication method according to claim 1, wherein the micro-machining step is implemented so as to make several analogue display members simultaneously in the same wafer.

3. The fabrication method according to claim 1, wherein the micro-machining step includes at least one lithographic step for reproducing on said wafer the contours of at least one portion of the main body of one analogue display member.

4. The fabrication method according to claim 1, wherein it includes at least one step of depositing a coating on at least one face of the main body of each analogue display member.

5. The fabrication method according to claim 1, wherein it includes at least one step of micro-machining the top face of the main body to form embossed patterns therein.

6. The fabrication method according to claim 1, wherein it includes at least one step of micro-machining the top face of the main body to form facets therein.

7. The fabrication method according to claim 1, wherein the crystalline material is monocrystalline silicon.

8. An analogue display member fitted to a timepiece, including a main body in which an arbor hole is made, said arbor hole being fitted to a drive arbor, wherein the main body is made of a silicon based crystalline material and wherein said arbor hole is provided with flexible elements that are made in a single piece with the main body in order to exert a gripping force on said drive arbor.

9. An analogue display member according to claim 8, wherein the flexible elements are in the form of tongues that project onto the inner surface of the arbor hole permitting the flexible elements to be resiliently deformed when said analogue display member is mounted on the drive arbor.

10. The analogue display member according to claim 8, wherein the main body has the shape of a timepiece hand.

11. The analogue display member according to claim 10, wherein the main body includes a proximal portion, in which the arbor hole is arranged, and a distal portion which forms the indicator section of the hand, and wherein the distal portion is connected to the proximal portion by at least one beam whose width, in a transverse plane to the arbor, is comprised between thirty and two hundred microns.

12. The analogue display member according to claim 8, wherein the main body includes, in the thickness thereof, a multitude of bores which are parallel to the drive arbor and which have a diameter smaller than fifty microns.

13. The analogue display member according to claim 8, wherein the top surface of the main body includes embossed patterns.

14. The analogue display member according to claim 8, wherein the top surface of the main body includes facets.

15. The analogue display member according to claim 8, wherein at least one face of the main body is provided with a coating made in a different material from the main body.

16. The analogue display member according to claim 15, wherein the coating is made of metal.

17. The analogue display member according to claim 8, wherein said analogue display includes at least one integrated circuit element which is arranged in the thickness of the main body.

18. The analogue display member according to claim 8, wherein the crystalline material is monocrystalline silicon.

19. A timepiece wherein said timepiece includes at least one analogue display member according to claim 8.

* * * * *